TRANSISTOR SWITCHING CIRCUIT

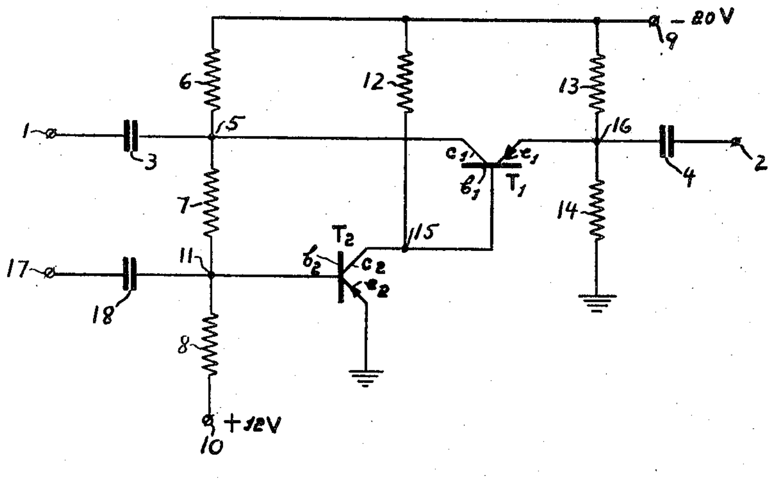
INVENTOR
ADRIANUS JOHANNES WILHELMUS MARIE VAN OVERBEEK
BY [signature]
AGENT 2,829,281

Adrianus Johannes Wilhelmus Marie van Overbeek, Eindhoven, Netherlands, assignor, by mesne assignments, to North American Philips Company, Inc., New York, N. Y., a corporation of Delaware Application September 8, 1955, Serial No. 533,183

Claims priority, application Netherlands September 8, 1954

4 Claims. (Cl. 307—88.5)

This invention concerns a transistor switching circuit and more particularly a circuit for closing and opening a line over which alternating currents, such as, for example, voice currents are transmitted in either direction.

A circuit of this type has been proposed, which comprises a junction transistor having an emitter electrode, a collector electrode, and a base electrode; the emitter and collector electrodes being connected in series with the line. Such a circuit may, for example, be used in circuit arrangements for automatic telephone systems as part of an electronic selector.

The circuit of the present invention comprises a first junction transistor and a second junction transistor, each having an emitter electrode, a collector electrode and a base electrode and each being either of PNP or of NPN type. The collector electrode of the second transistor is connected to the base electrode of the first transistor and the emitter electrode of the second transistor is connected to a point of constant (ground) potential. The base electrode of the second transistor is connected to the collector electrode of the first transistor in such a manner that each transistor is alternately conducting while the other transistor is alternately non-conducting. When the first transistor is conducting, the differential resistance between the collector and emitter electrodes of the first transistor is comparatively low, and the second transistor is non-conducting, so that the differential resistance between the collector and emitter electrodes of the second transistor is comparatively high. When the first transistor is non-conducting, the differential resistance between the collector and emitter electrodes of the first transistor is comparatively high, and the second transistor is conducting, so that the differential resistance between the collector and emitter electrodes of the second transistor is comparatively low.

The principal object of this invention is the provision of a transistor switching circuit of new and improved configuration.

An object of this invention is the provision of a new and improved circuit for closing and opening an alternating current line.

A further object of this invention is the provision of a new and improved transistor switching circuit of high operating efficiency.

The above and other objects of the invention will become apparent from a consideration of the following detailed description taken in connection with the accompanying drawing, in which the figure is a schematic diagram of an embodiment of the transistor switching circuit of the present invention.

The transistor switching circuit closes and opens a line (not shown) through which an alternating current flows and which is connected to terminals 1 and 2. The switching circuit comprises two junction transistors $T_1$ and $T_2$; the first transistor $T_1$ comprising an emitter electrode $e_1$, a collector electrode $c_1$ and a base electrode $b_1$, and the second transistor $T_2$ comprising an emitter electrode $e_2$, a collector electrode $c_2$ and a base electrode $b_2$. In the embodiment of the invention shown in the figure, the transistor are of PNP type. Transistors of NPN type may be utilized if proper polarity changes are made in the circuit.

The transistor $T_1$ acts as the switch contact. The collector electrode $c_1$ is connected through a coupling capacitor 3 to the terminal 1 and the emitter electrode $e_1$ is connected to the terminal 2 through a capacitor 4. The collector electrode $c_1$ is connected to a first tapping point 5 of a voltage divider 6, 7, 8 which is connected between a negative supply terminal 9 having a potential of —20 volts and a positive supply terminal 10 having a potential of +12 volts.

The base electrode $b_2$ of the transistor $T_2$ is connected to a second tapping point 11 of said voltage divider. The emitter electrode $e_2$ is connected to a point at ground potential. The base electrode $b_1$ of the transistor $T_1$ is connected to the collector electrode $c_2$ of the transistor $T_2$ and to the supply terminal 9 through a resistor 12. The emitter electrode $e_1$ is biased through a voltage divider 13, 14.

The switching circuit of the figure may have two different electrically stable conditions. In one condition, the electrical contact is closed; that is, the transistor $T_1$ is conducting, in which case the differential resistance between the collector electrode $c_1$ and the emitter electrode $e_1$ is comparatively low. The potential of the points 11, 5, 15 and 16 may then correspond, for example, to +1.0 volt, —6.1 volts, —6.4 volts and —6.1 volts, respectively. The voltage of the base electrode $b_2$ is consequently positive relative to the voltage of the collector electrode $c_2$ and the emitter electrode $e_2$, so that the transistor $T_2$ is blocked and represents a high leak resistance, of 100,000 ohms or more, from the base electrode $b_1$ to ground. If, for example, the load on the terminals 1, 2 is equal to 600 ohms, corresponding to the surge impedance of a transmission line, the damping by the transistor contact may, as measured, be lower than 0.5 db. in both directions.

In the other condition, the electrical contact is open; that is, the transistor $T_1$ is non-conducting and the transistor $T_2$ is conducting, in which case the differential resistance between the collector electrode $c_1$ and the emitter electrode $e_1$ is high with respect to direct voltage variations. The potential of the points 11, 5, 15 and 16, may then correspond, for example, to —0.1 volt, —10.0 volts, —0.2 volt and —2.5 volts, respectively. However, some transmission of alternating currents may still occur between the terminals 1 and 2 through the capacitative coupling between the collector electrode $c_1$ and the base electrode $b_1$ and between the base electrode $b_1$ and the emitter electrode $e_1$. However, the transistor $T_2$ is conductive and there is a comparatively low differential resistance between the collector electrode $c_2$ and the emitter electrode $e_2$, so that the base electrode $b_1$ is effectively grounded with respect to alternating voltage.

The circuit may be switched from the conducting condition to the non-conducting condition, or, from the non-conducting condition to the conducting condition, under the control of pulses at a terminal 17. The base electrode $b_2$ is connected to the terminal 17 through a capacitor 18. If desired, the circuit may also be controlled by pulses supplied through the line itself. For example, pulses may be supplied through the terminal 1, in which case the point 11 must be capacitively coupled to the terminal 1.

It is to be understood that the invention is not limited to the details disclosed but includes all such variations and modifications as fall within the spirit of the invention and the scope of the appended claims.

What is claimed is:

1. A transistor switching circuit for closing and opening an alternating current line, comprising a first junction transistor, a second junction transistor, each of said transistors having an emitter electrode, a collector electrode and a base electrode, means for connecting the emitter and collector electrodes of said first transistor in series with said line, means for connecting the base electrode of said first transistor to the collector electrode of said second transistor, means for connecting the emitter electrode of said second transistor to a point of constant potential, means for connecting the base electrode of said second transistor to the collector electrode of said first transistor, means for biasing one of said transistors in normally conducting condition and for biasing the other of said transistors in normally non-conducting condition, and means for applying a control pulse to the base electrode of said second transistor thereby to bias said conducting transistor to a non-conducting condition and to bias said non-conducting transistor to a conducting condition in accordance with the magnitude and polarity of said control pulse.

2. A transistor switching circuit for closing and opening an alternating current line, comprising a first junction transistor, a second junction transistor, each of said transistors having an emitter electrode, a collector electrode and a base electrode, means for connecting the emitter and collector electrodes of said first transistor in series with said line, means for connecting the base electrode of said first transistor to the collector electrode of said second transistor, means for connecting the emitter electrode of said second transistor to a point of constant potential and means for connecting the base electrode of said second transistor to the collector electrode of said first transistor, said means comprising voltage dividing means and means for applying a control pulse to said last mentioned connecting means thereby to bias said first transistor to a conducting condition when said second transistor is biased to a non-conducting condition and to bias said first transistor to a non-conducting condition when said second transistor is biased to a conducting condition in accordance with the magnitude and polarity of said control pulse.

3. A transistor switching circuit for closing and opening an alternating current line, comprising a first junction transistor, a second junction transistor, each of said transistors having an emitter electrode, a collector electrode and a base electrode, a pair of coupling capacitors, means for connecting the emitter and collector electrodes of said first transistor in series with said line through said coupling capacitors, means for connecting the base electrode of said first transistor to the collector electrode of said second transistor, means for connecting the emitter electrode of said second transistor to a point of constant potential, voltage dividing means, a source of supply voltage connected across said voltage dividing means, means for connecting the base electrode of said second transistor to the collector electrode of said first transistor through a portion of said voltage dividing means, and means for applying a control pulse to the base electrode of said second transistor thereby to change the conducting condition of said transistors in accordance with the magnitude and polarity of said control pulse.

4. A transistor switching circuit for closing and opening an alternating current line, comprising a first junction transistor, a second junction transistor, each of said transistors having an emitter electrode, a collector electrode and a base electrode, a pair of coupling capacitors, means for connecting the emitter and collector electrodes of said first transistor in series with said line through said coupling capacitors, means for connecting the base electrode of said first transistor to the collector electrode of said second transistor, means for connecting the emitter electrode of said second transistor to a point at ground potential, voltage dividing means, a source of supply voltage connected across said voltage dividing means, means for connecting the base electrode of said second transistor to the collector electrode of said first transistor through a portion of said voltage dividing means, second voltage dividing means connected between the negative terminal of said supply source and a point at ground potential and having a common junction with said first mentioned means between the emitter electrode of said first transistor and one of said coupling capacitors, a third coupling capacitor, and means for applying a control pulse to the common junction of the base electrode of said second transistor and said voltage dividing means through said third coupling capacitor.

References Cited in the file of this patent

UNITED STATES PATENTS

| | | |
|---|---|---|
| 2,698,416 | Sherr | Dec. 28, 1954 |
| 2,718,591 | Hedeman | Sept. 20, 1955 |